(12) United States Patent
Yen et al.

(10) Patent No.: US 8,384,159 B2
(45) Date of Patent: Feb. 26, 2013

(54) SEMICONDUCTOR DEVICES AND METHODS WITH BILAYER DIELECTRICS

(75) Inventors: Fong-Yu Yen, Taoyuan County (TW); Cheng-Lung Hung, Hsinchu (TW); Peng-Fu Hsu, Hsinchu (TW); Vencent S. Chang, Hsin-Chu (TW); Yong-Tian Hou, Singapore (SG); Jin Ying, Singapore (SG); Hun-Jan Tao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 239 days.

(21) Appl. No.: 12/426,477

(22) Filed: Apr. 20, 2009

(65) Prior Publication Data

US 2009/0315125 A1  Dec. 24, 2009

Related U.S. Application Data

(62) Division of application No. 11/532,308, filed on Sep. 15, 2006, now Pat. No. 7,531,399.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .......... 257/369; 257/411; 257/E27.06; 257/E27.062

(58) Field of Classification Search .......... 257/368, 257/369, 410, 411, 412, E27.06, E27.062
See application file for complete search history.

(56) References Cited

U.S. PATENT DOCUMENTS

| 7,157,780 B2 | 1/2007 | Harada |
| 2002/0047170 A1 | 4/2002 | Ota |
| 2004/0012043 A1 | 1/2004 | Gealy et al. |
| 2005/0098839 A1 | 5/2005 | Lee et al. |
| 2006/0022252 A1* | 2/2006 | Doh et al. ............ 257/314 |
| 2006/0054980 A1 | 3/2006 | Kim et al. |
| 2006/0270239 A1 | 11/2006 | Triyoso et al. |

* cited by examiner

*Primary Examiner* — Hoai V Pham
(74) *Attorney, Agent, or Firm* — Haynes and Boone, LLP

(57) ABSTRACT

A semiconductor device is disclosed that includes: a substrate; a first dielectric layer formed over the substrate and formed of a first high-k material, the first high-k material selected from the group consisting of $HfO_2$, HfSiO, HfSiON, HfTaO, HfTiO, HfTiTaO, HfAlON, and HfZrO; a second dielectric layer formed over the first dielectric layer and formed of a second high-k material, the second high-k material being different than the first high-k material and selected from the group consisting of $HfO_2$, HfSiO, HfSiON, HfTaO, HfTiO, HfTiTaO, HfAlON, and HfZrO; and a metal gate formed over the second dielectric layer. The first dielectric layer includes ions selected from the group consisting of N, O, and Si.

19 Claims, 7 Drawing Sheets

US 8,384,159 B2

SEMICONDUCTOR DEVICES AND METHODS WITH BILAYER DIELECTRICS

CROSS REFERENCE

This application is a Divisional of U.S. patent application Ser. No. 11/532,308, filed Sep. 15, 2006, which is hereby incorporated by reference in its entirety.

BACKGROUND

Embodiments of the present disclosure relate generally to semiconductor devices and methods of manufacturing semiconductor devices, and more particularly to semiconductor devices and methods having a bi-layer, high-k dielectric.

Gate electrodes affect the performance of a semiconductor device. As the gate dielectric layer thickness is reduced, the drive current can be increased, increasing the device performance. However, as the gate dielectric layer becomes thinner, gate leakage is induced, increasing power consumption and reducing device performance. Metal gate electrodes have been used to reduce the effective thickness of the gate dielectric layer and to reduce gate leakage. However, semiconductor devices utilizing metal gates have suffered from such problems as high leakage currents, poly depletion, slower switching speeds, and higher effective work functions. Although the existing devices and methods have been generally adequate for their intended purposes, they have not been entirely satisfactory in all respects.

DETAILED DESCRIPTION

Referring to FIGS. 1-5, shown therein is a device according to one embodiment of the present disclosure during various stages of fabrication.

Figure 1:
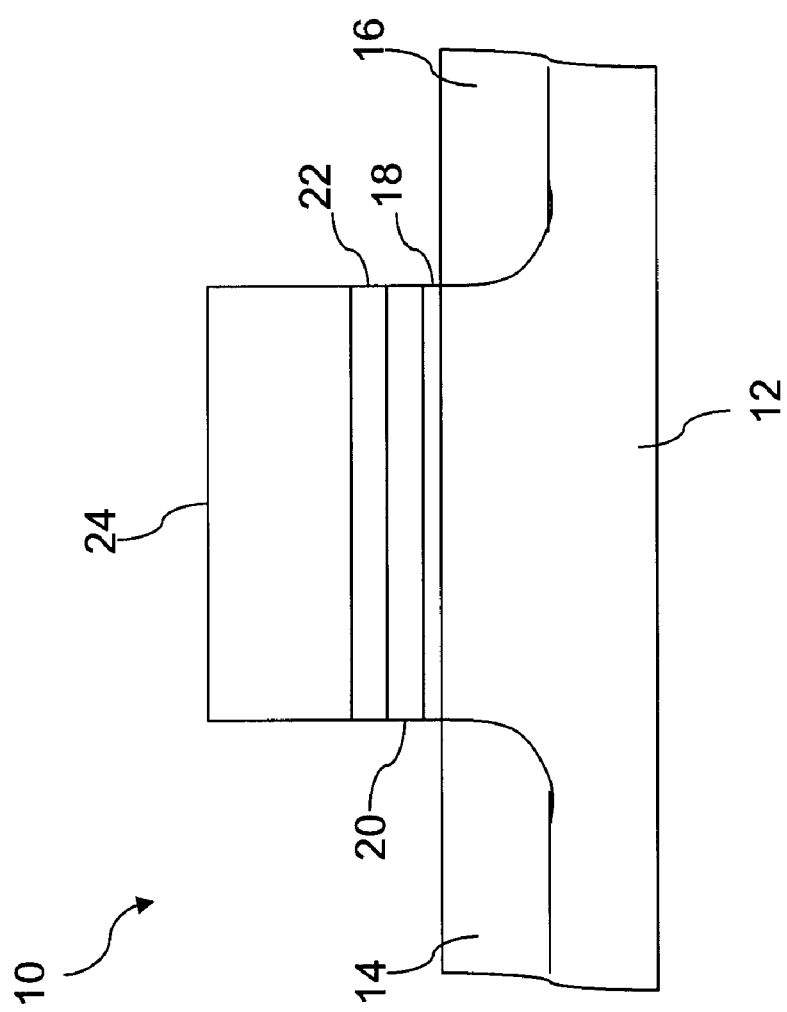
FIG. 1 is a diagrammatic sectional view of one embodiment of a semiconductor device according to the present invention.

FIG. 1 is a diagrammatic sectional view of a completed device 10 manufactured according to aspects of the present disclosure. Generally, the device 10 includes a substrate 12 that includes a source region 14 and a drain region 16; an interfacial layer 18 formed directly on the substrate 12; a dielectric layer 20 formed on the interfacial layer 18; a dielectric layer 22 formed on the dielectric layer 20; and a metal gate 24 formed on the dielectric layer 22.

Figure 2:
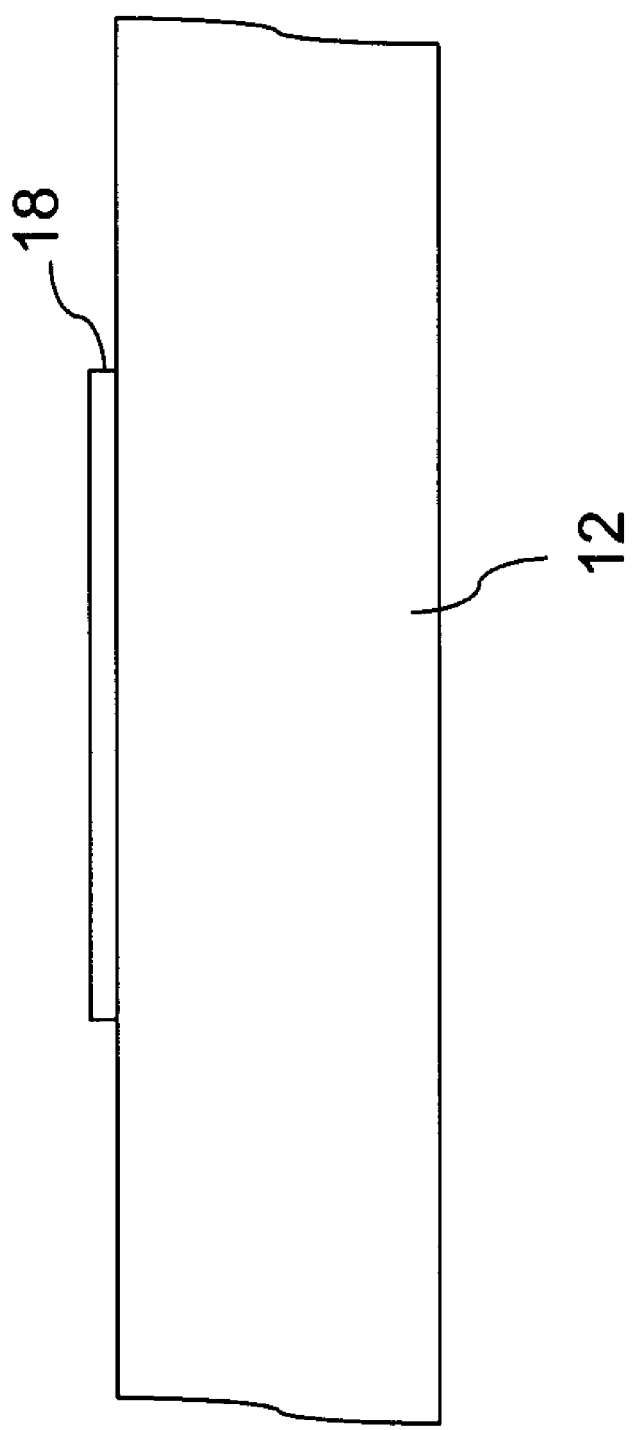
FIGS. 2-5 illustrate sectional views of the embodiment of the semiconductor device shown in FIG. 1 during various fabrication stages.

FIG. 2 shows an intermediate stage of the fabrication of the device 10 where the interfacial layer 18 has been formed directly on the substrate 12. In the present embodiment, the substrate 12 is made of silicon (Si). Alternatively, the substrate 12 can be made of other suitable semiconductor materials, such as germanium (Ge), silicon-germanium (SiGe), and gallium arsenide (GaAs); other suitable elementary semiconductor materials, such as diamond; other suitable compound semiconductor materials, such as silicon carbide (SiC), indium arsenide (InAs), and indium phosphide (InP); and other suitable alloy semiconductor material materials, such as silicon-germanium carbide (SiGeC), gallium arsenide phosphide (GaAsP), and indium gallium phosphide (InGaP). The substrate 12 may include various doped regions, dielectric features, and multilevel interconnects. These features may be formed prior to or subsequent to formation of the interfacial layer 18.

The interfacial layer 18 is made of silicon oxide ($SiO_2$) and formed on the substrate 12 by wet etching. Alternatively, the interfacial layer 18 may be formed by rapid thermal oxidation (RTO). Further, the interfacial layer 18 may be formed of silicon oxynitride (SiON). In the present embodiment, the layer 18 has a thickness of less than 1 nm. In other embodiments, the layer 18 can have a greater thickness. Further, in some embodiments the interfacial layer 18 may be omitted entirely and the dielectric layer 20 formed directly on the substrate 12.

Figure 3:
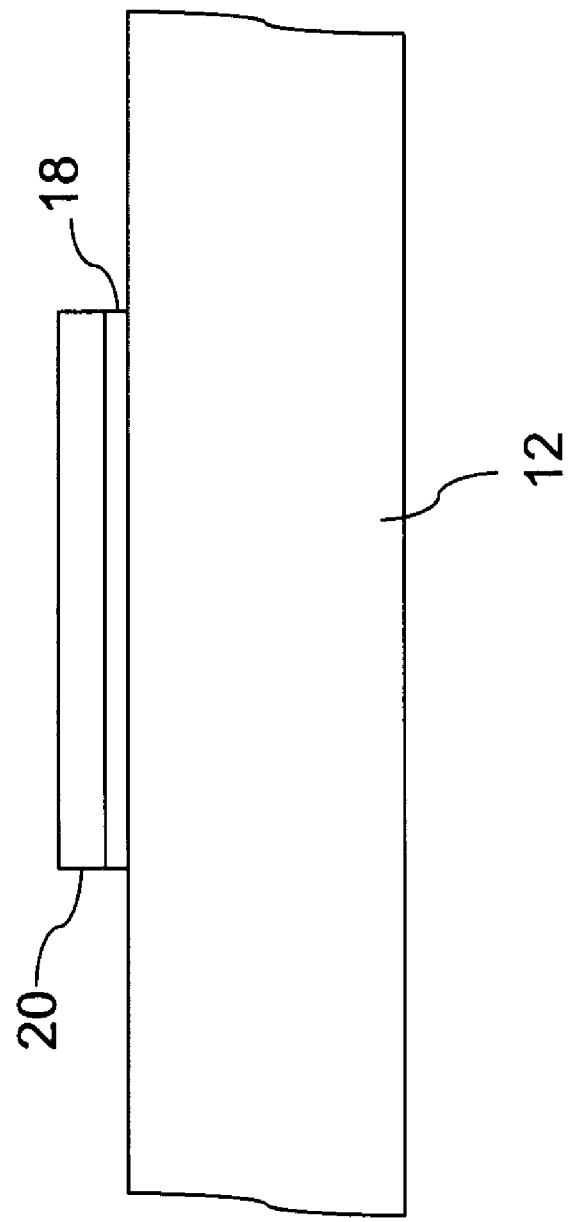

FIG. 3 shows an intermediate stage of the fabrication of the device 10 where the dielectric layer 20 has been formed directly on the interfacial layer 18 by atomic layer deposition (ALD). The dielectric layer 20 is formed from a high-k dielectric material, hafnium silicon oxide (HfSiO). In the present embodiment, the dielectric layer 20 has a thickness in the range of 1-10 nm. Alternatively, the dielectric layer 20 may be formed by ALD, chemical vapor deposition (CVD), metal-organic chemical vapor deposition (MOCVD), physical vapor deposition (PVD), and combinations thereof. Further, the dielectric layer 20 can be formed from other high-k dielectric materials with a dielectric constant of 8 or more. In particular, the dielectric layer 20 can be made of hafnium oxide ($HfO_2$), hafnium silicon oxynitride (HfSiON), hafnium tantalum oxide (HfTaO), hafnium titanium oxide (HfTiO), hafnium titanium tantalum oxide (HfTiTaO), hafnium aluminum iodine oxynitride (HfAlON), and hafnium zirconium oxide (HfZrO). Also in other embodiments, the dielectric layer 20 may have a smaller or larger thickness.

After formation, the dielectric layer 20 is subjected to a surface treatment. The surface treatment includes a nitridation technique followed by an anneal. In particular, the dielectric layer 20 is subjected to plasma nitridation. The parameters of the plasma nitridation are: Chemical: N2 plasma; Power: 600-1500 W; Pressure: 30 mTorr-100 mTorr; Time: 10-300 seconds. The parameters of the post deposition anneal are: Temp: 800-1200° C.; Chemical Options: O2/N2 ambient and O2 partial; Pressure: 0.0001-0.01 Torr; Time: 5-60 seconds. Alternatively, the nitridation technique can be a thermal nitridation wherein the atomic ratio of nitrogen is between 0-30%. Further, in other embodiments the dielectric layer 20 can be implanted with a species different than nitrogen, such as oxygen or silicon, using an appropriate technique. In other embodiments, the post deposition anneal can utilize $N_2$, $O_2$, $H_2$, $D_2$, $NH_3$, Ar, and combinations thereof at temperatures between 400-1200° C. Further, in some embodiments the nitridation/implantation and anneal may be omitted entirely.

Figure 4:
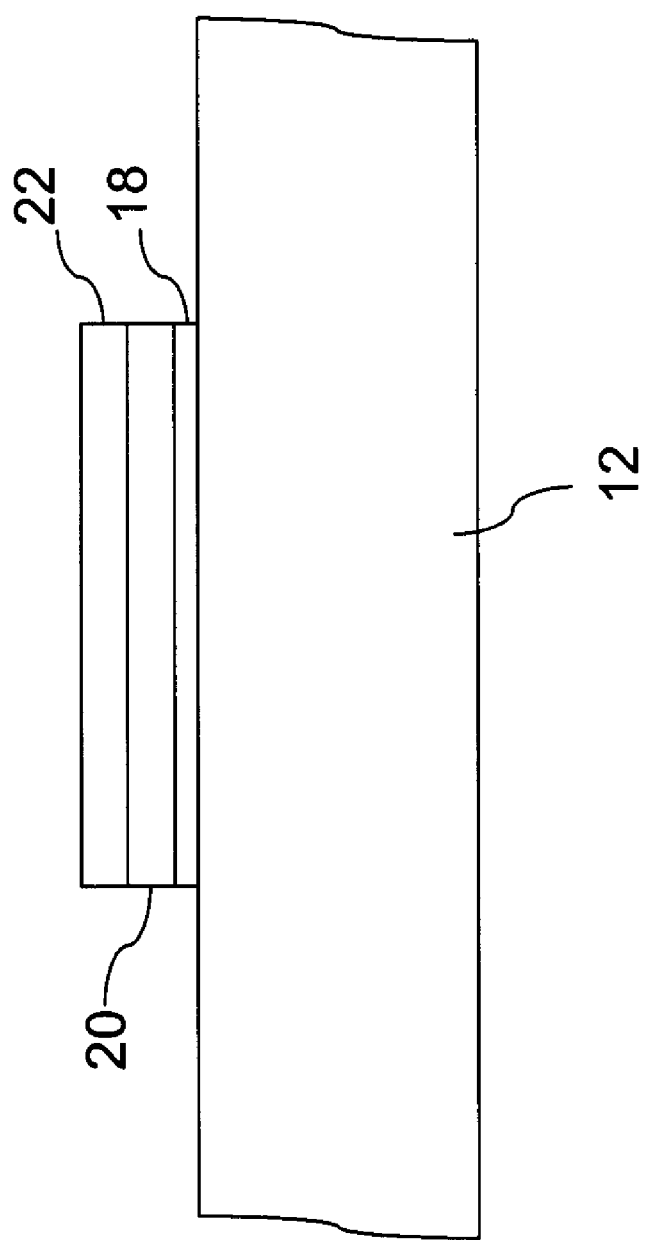

FIG. 4 shows an intermediate stage of the fabrication of the device 10 where the dielectric layer 22 has been formed on the dielectric layer 20 by atomic layer deposition (ALD). The dielectric layer 22 is formed a different high-k dielectric material than dielectric layer 20. In the present embodiment, the dielectric layer 22 is formed of hafnium oxide ($HfO_2$). In the present embodiment, the dielectric layer 22 has a thickness in the range of 0.3-2.0 nm. Together, the dielectric layers 20 and 22 serve to form a bi-layer dielectric. Alternatively, the dielectric layer 22 may be formed by ALD, chemical vapor deposition (CVD), metal-organic chemical vapor deposition (MOCVD), physical vapor deposition (PVD), and combinations thereof. Further, the dielectric layer 22 can be formed from other high-k dielectric materials with a dielectric constant of 8 or more. In particular, the dielectric layer 22 can be made of hafnium silicon oxide (HfSiO), hafnium silicon oxynitride (HfSiON), hafnium tantalum oxide (HfTaO), hafnium titanium oxide (HfTiO), hafnium titanium tantalum oxide (HfTiTaO), hafnium aluminum iodine oxynitride (HfAlON), and hafnium zirconium oxide (HfZrO). Also in other embodiments, the dielectric layer 22 may have a smaller or larger thickness.

After formation, the dielectric layer 22 is subjected to a surface treatment. The surface treatment may be substantially similar to the surface treatment for dielectric layer 20. The surface treatment includes a nitridation technique followed by an anneal. In particular, the dielectric layer 20 is subjected to plasma nitridation. The parameters of the plasma nitridation are: Chemical: N2 plasma; Power: 600-1500 W; Pressure: 30 mTorr-100 mTorr; Time: 10-300 seconds. The parameters of the post deposition anneal are: Temp: 800-1200° C.; Chemical Options: O2/N2 ambient and O2 partial; Pressure: 0.0001-0.01 Torr; Time: 5-60 seconds. Alternatively, the nitridation technique can be a thermal nitridation wherein the atomic ratio of nitrogen is between 0-30%. Further, in other embodiments the dielectric layer 22 can be implanted with a species different than nitrogen, such as oxygen or silicon, using an appropriate technique. In other embodiments, the post deposition anneal can utilize $N_2$, $O_2$, $H_2$, $D_2$, $NH_3$, Ar, and combinations thereof at temperatures between 400-1200° C. Further, in some embodiments the nitridation/implantation and anneal may be omitted entirely.

Figure 5:
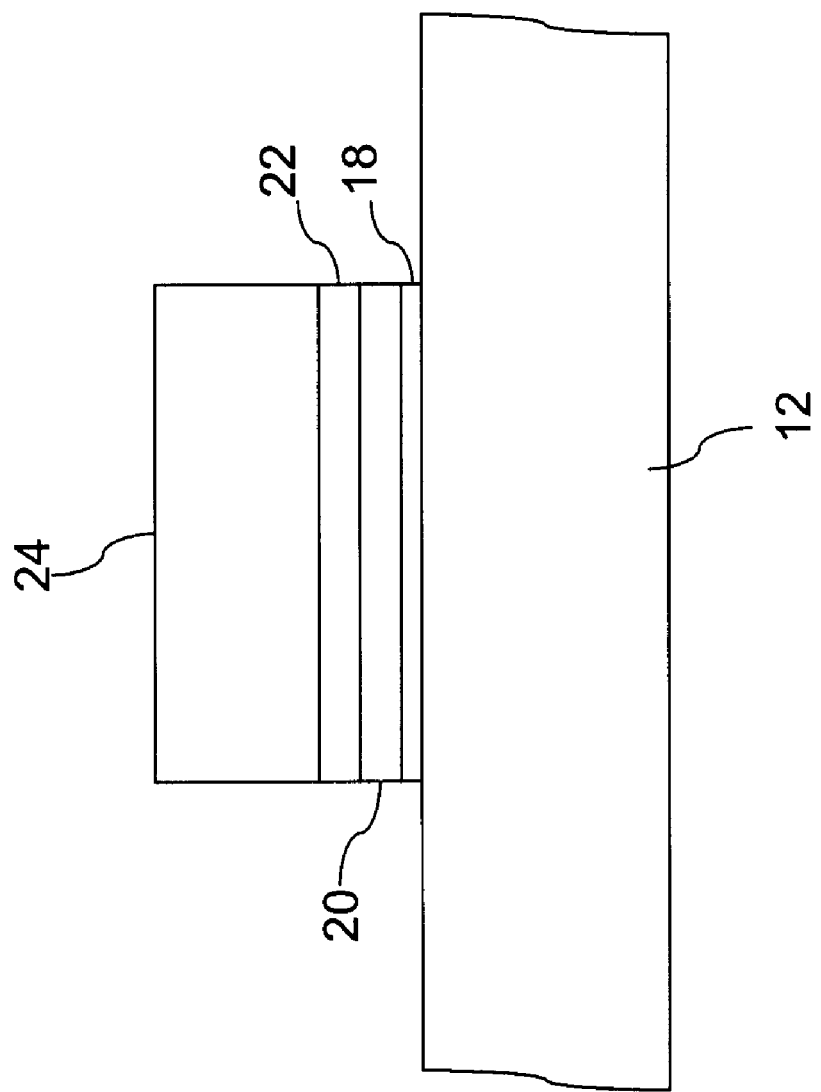

FIG. 5 shows an intermediate stage of the fabrication of the device 10 where the metal gate 24 has been formed on the dielectric layer 22 by physical vapor deposition (PVD). In the present embodiment, the metal gate 24 is formed of tantalum carbide (TaC). Alternatively, the gate 24 can be formed by atomic layer deposition (ALD) or metal-organic chemical vapor deposition (MOCVD). Further, the gate 24 can be formed from other suitable metals, such as tantalum nitride (TaN), tantalum silicon (TaSi), tantalum silicon nitride (TaSiN), ruthenium (Ru), molybdenum nitride ($Mo_2N$), iridium silicon ($IrSi_3$), and platinum (Pt).

After formation of the metal gate 24, the device 10 may be subjected to additional processing steps, including conventional CMOS manufacturing steps. For example, the source and drain regions 14, 16 of the substrate 12 can be formed subsequent to the formation of the metal gate. Additional features of the substrate 12 and the semiconductor device 10, in general, can be formed prior to, within, or subsequent to the fabrication stages described above.

Figure 6:
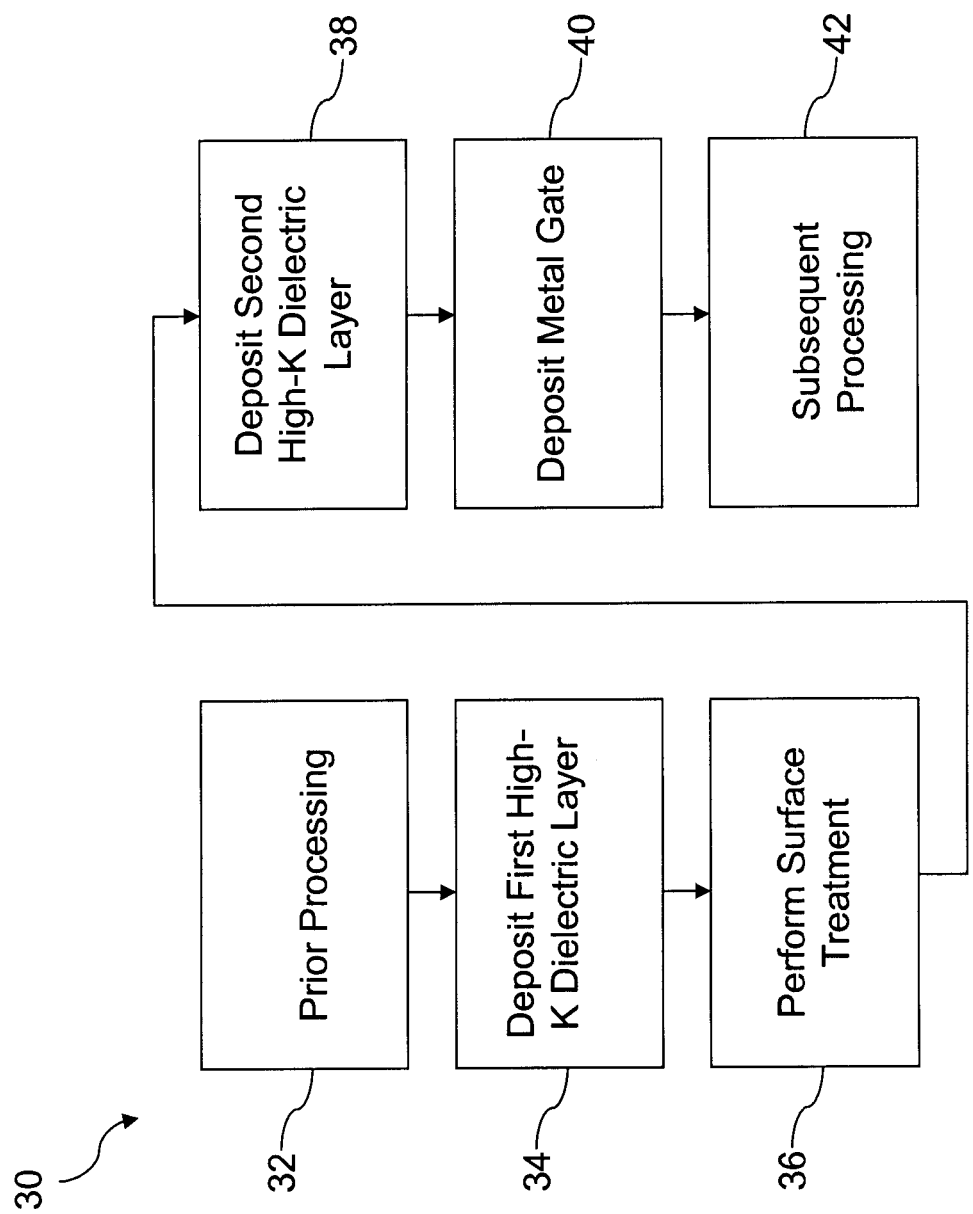
FIG. 6 is a flow chart of one embodiment of a method of manufacturing a semiconductor device according to the present invention.

FIG. 6 is a flowchart of an embodiment of a method 30 of forming a semiconductor device with a bi-layer dielectric as a further illustration of the fabrication described above with reference to FIGS. 1-5. The method 30 begins with step 32 that includes all prior processing and fabrication steps. The method 30 continues with step 34, the deposition of a first high-k dielectric layer. At step 36, the method 30 subjects the first high-k dielectric layer to a surface treatment. At step 38, the method 30 continues with the deposition of a second high-k dielectric layer. Then, at step 40 the method 30 deposits a metal gate. After step 40, the method 30 concludes with step 42 that includes all subsequent processing and fabrication steps.

Figure 7:
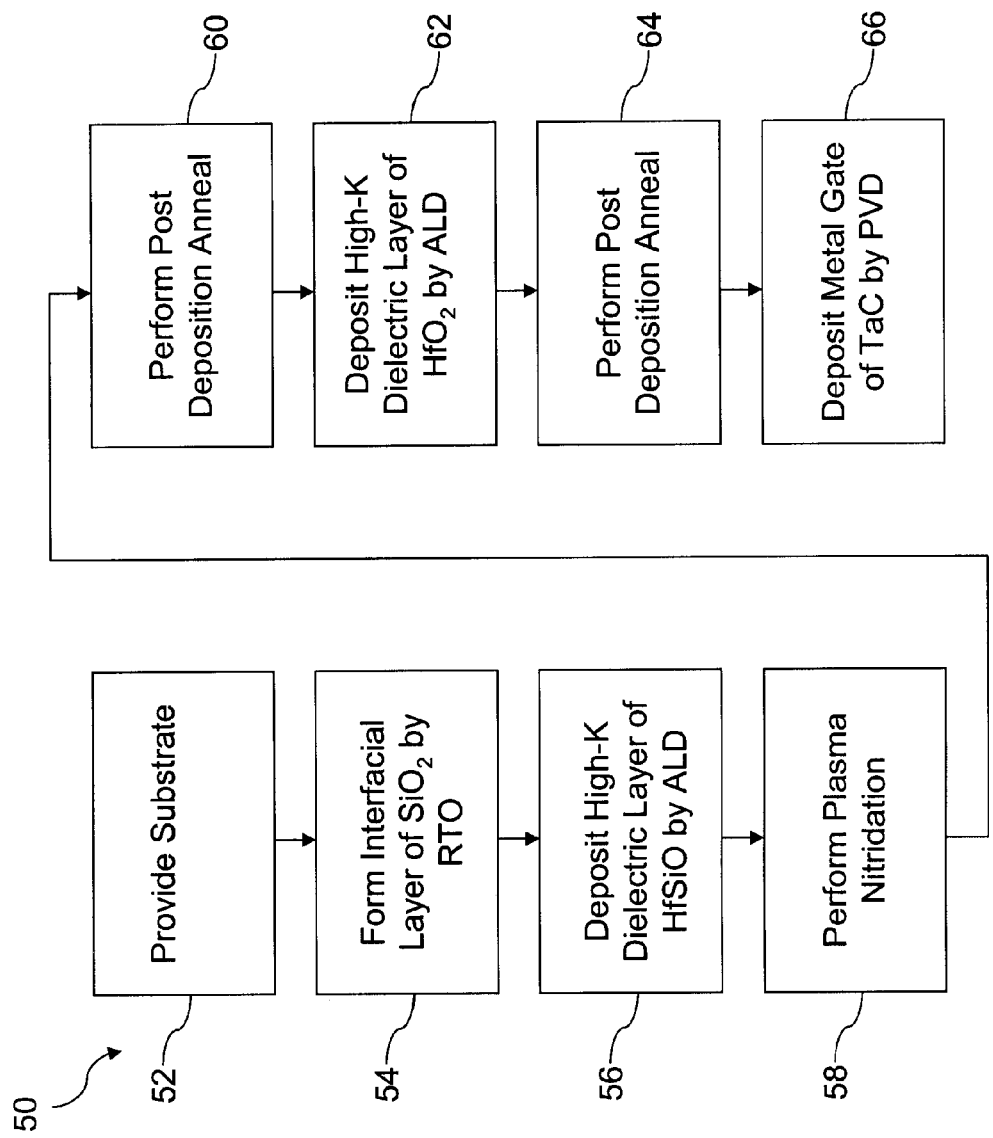
FIG. 7 is a flow chart of another embodiment of a method of manufacturing a semiconductor device according to the present invention.

FIG. 7 is a flowchart of an embodiment of a method 50 of forming a semiconductor device with a bi-layer dielectric as a further illustration of the fabrication described above with reference to FIGS. 1-6. The method 50 begins with step 52 by providing a substrate. The method 50 continues with step 54, forming an interfacial layer of $SiO_2$ by rapid thermal oxidation (RTO). At step 56, the method 50 deposits a high-k dielectric layer of HfSiO by atomic layer deposition (ALD). The method 50 then performs a plasma nitridation at step 58. Following step 58, the method 50 includes a post deposition anneal. At step 60, the method 50 continues with the deposition of a high-k dielectric layer of $HfO_2$ by ALD. Then, at step 62 the method 50 performs an additional post deposition anneal. After step 62, the method 30 concludes with step 64 by depositing a metal gate of TaC by physical vapor deposition (PVD). Methods 30 and 50 are merely for illustrative purposes. In other embodiments, the methods 30 and 50 can include additional steps, intermediate steps, and/or may omit steps recited above.

In use, the $1^{st}$ high-k dielectric is used to facilitate better reliability and mobility for device, while the second high-k dielectric is used to adjust the effective work function (EWF) of the metal gate. In some embodiments, the Si from the dielectric layer can contact the metal gate and cause changes to the EWF of the metal gate. For example, where the Si from HfSiON contacts a TaC metal gate, the effective work function of TaC can shift toward mid-gap. Thus, the insertion of a second high-k dielectric layer comprised of a material not containing Si, such as $HfO_2$, can help to maintain the lower EWF. Thus, in some embodiments the material of the second high-k dielectric layer does not include Si. Further, the nitridation of the $1^{st}$ high-k dielectric layer can prevent unwanted atoms, such as the Si in HfSiO, from contacting the metal gate and shifting the EWF.

While numerous alternatives and variations have been suggested throughout this disclosure, additional changes, substitutions, and alterations can be made herein without departing from the spirit and scope of the present disclosure. Accordingly, all such modifications and alternatives are intended to be included within the scope of the invention as defined in the following claims. Those skilled in the art should recognize that such modifications and equivalent constructions and methods do not depart from the spirit and scope of the present disclosure. It is understood that all spatial references, such as "horizontal," "vertical," "top," "upper," "lower," "bottom," "left," and "right," are for illustrative purposes only and can be varied within the scope of the disclosure. In the claims, means-plus-function clauses are intended to cover the structures described herein as performing the recited function and not only structural equivalents, but also equivalent structures.

Thus, in one embodiment the present disclosure provides a semiconductor device having a substrate; a first dielectric layer formed over the substrate and formed of a high-k material; a second dielectric layer formed over the first dielectric layer and formed of a different high-k material; and a metal gate formed over the second dielectric layer. The semiconductor device may also include an interfacial layer positioned between the substrate and the first dielectric layer. In some embodiments, the first and second dielectric layers are formed from materials selected from the group consisting of $HfO_2$, HfSiO, HfSiON, HfTaO, HfTiO, HfTiTaO, HfAlON, and HfZrO. Further, in some embodiments the metal gate is formed from a material selected from the group consisting of TaC, TaN, TaSi, TaSiN, Ru, $Mo_2N$, $IrSi_3$, and Pt.

In another embodiment, the present disclosure provides a method of fabricating a semiconductor device. The method includes: providing a substrate; forming a first dielectric layer of a first high-k material above the substrate; forming a second dielectric layer of a second high-k material above the first dielectric layer, the second material being different than the first material; and forming a gate structure above the second dielectric layer. Further, the method may include forming an interfacial layer above the substrate prior to forming the first dielectric layer. The method can also include performing a nitridation technique on the first dielectric layer prior to forming the second dielectric layer. In some embodiments, the nitridation technique is plasma nitridation or thermal nitridation. Alternatively, the method can include implanting ions, such as N, O, and/or Si into the first dielectric layer. In some embodiments, the method includes performing a post deposition anneal on the first dielectric layer. The post deposition anneal is performed after the nitridation technique and before forming the second dielectric layer in some embodiments. Further, in some embodiments the second dielectric layer may be subjected to nitridation, ion implantation, and/or post deposition annealing.

What is claimed is:

1. A semiconductor device comprising:
a substrate;
a first dielectric layer formed directly on the substrate and formed of a first high-k material, the first high-k material selected from the group consisting of $HfO_2$, HfSiO, HfTaO, HfTiO, HfTiTaO, HfAlON, and HfZrO;
a second dielectric layer formed over the first dielectric layer and formed of a second high-k material, the second high-k material being different than the first high-k material and selected from the group consisting of $HfO_2$, HfSiO, HfSiON, HfTaO, HfTiO, HfTiTaO, HfAlON, and HfZrO; and
a metal gate formed over the second dielectric layer;
wherein the first dielectric layer includes ions of an element not present in the first high-k material.

2. The semiconductor device of claim 1, wherein the metal gate is formed of a metal selected from the group consisting of TaC, TaN, TaSi, TaSiN, Ru, $Mo_2N$, $IrSi_3$, and Pt.

3. The semiconductor device of claim 2, wherein the first dielectric layer has a thickness ranging from about 1 nm to about 10 nm.

4. The semiconductor device of claim 3, wherein the second dielectric layer has a thickness ranging from about 0.3 nm to about 2.0 nm.

5. The semiconductor device of claim 4,
wherein the first dielectric layer is positioned between the substrate and the second dielectric layer; and
wherein the second dielectric layer is positioned between the first dielectric layer and the metal gate.

6. The semiconductor device of claim 5,
wherein the first high-k material is HfSiO;
wherein the second high-k material is $HfO_2$; and
wherein the metal gate is formed of TaC.

7. The semiconductor device of claim 1, wherein the second high-k material is free of Si.

8. The semiconductor device of claim 7, wherein the first dielectric layer has a thickness ranging from about 1 nm to about 10 nm.

9. The semiconductor device of claim 8, wherein the second dielectric layer has a thickness ranging from about 0.3 nm to about 2.0 nm.

10. The semiconductor device of claim 7, wherein the metal gate is formed of a metal selected from the group consisting of TaC, TaN, TaSi, TaSiN, Ru, $Mo_2N$, $IrSi_3$, and Pt.

11. A semiconductor device comprising:
a substrate;
an HfSiO layer formed directly on the substrate;
an $HfO_2$ layer formed on the HfSiO layer; and
a metal gate formed on the $HfO_2$ layer;
wherein the HfSiO layer is implanted with N ions.

12. The semiconductor device of claim 11, wherein the metal gate is formed of a metal selected from the group consisting of TaC, TaN, TaSi, TaSiN, Ru, $Mo_2N$, $IrSi_3$, and Pt.

13. The semiconductor device of claim 12, wherein the metal gate is formed of TaC.

14. The semiconductor device of claim 11, wherein the HfSiO layer has a thickness ranging from about 1 nm to about 10 nm.

15. The semiconductor device of claim 14, wherein the $HfO_2$ layer has a thickness ranging from about 0.3 nm to about 2.0 nm.

16. A semiconductor device comprising:
a substrate;
a first dielectric layer formed over the substrate and formed of a first high-k material, the first high-k material having a dielectric constant of 8 or more;
a second dielectric layer formed over the first dielectric layer and formed of a second high-k material, the second high-k material being different than the first high-k material, having a dielectric constant of 8 or more, and being free of Si; and
a metal gate formed over the second dielectric layer;
wherein the first dielectric layer includes implant ions of an element not present in the first high-k material; and
wherein the second dielectric layer is free of the implant ions.

17. The semiconductor device of claim 16, wherein the first high-k material is selected from the group consisting of $HfO_2$, HfSiON, HfTaO, HfTiO, HfTiTaO, HfAlON, and HfZrO.

18. The semiconductor device of claim 16, wherein the second high-k material is selected from the group consisting of HfTaO, HMO, HfTiTaO, HfAlON, and HfZrO.

19. The semiconductor device of claim 16, wherein the metal gate is formed of a metal selected from the group consisting of TaN, TaSi, Ru, $Mo_2N$, $IrSi_3$, and Pt.

* * * * *